(12) United States Patent
Shibasaki et al.

(10) Patent No.: US 11,302,831 B2
(45) Date of Patent: Apr. 12, 2022

(54) SOLAR CELL, MULTI-JUNCTION SOLAR CELL, SOLAR CELL MODULE, AND SOLAR POWER GENERATION SYSTEM

(71) Applicants: Kabushiki Kaisha Toshiba, Minato-ku (JP); Toshiba Energy Systems & Solutions Corporation, Kawasaki (JP)

(72) Inventors: Soichiro Shibasaki, Nerima (JP); Mutsuki Yamazaki, Yokohama (JP); Kazushige Yamamoto, Yokohama (JP); Yuya Honishi, Kawasaki (JP)

(73) Assignees: Kabushiki Kaisha Toshiba, Minato-ku (JP); Toshiba Energy Systems & Solutions Corporation, Kawasaki (JP)

( * ) Notice: Subject to any disclaimer, the term of this patent is extended or adjusted under 35 U.S.C. 154(b) by 0 days.

(21) Appl. No.: 16/556,345

(22) Filed: Aug. 30, 2019

(65) Prior Publication Data
US 2019/0386161 A1  Dec. 19, 2019

Related U.S. Application Data

(63) Continuation of application No. PCT/JP2018/031452, filed on Aug. 24, 2018.

(30) Foreign Application Priority Data

Mar. 22, 2018  (JP) .............................. JP2018-054825

(51) Int. Cl.
*H01L 31/0224*  (2006.01)

(52) U.S. Cl.
CPC ................ *H01L 31/022441* (2013.01); *H01L 31/022433* (2013.01)

(58) Field of Classification Search
CPC .......... H01L 31/03923; H01L 31/0322; H01L 31/0323; H01L 31/03928; H01L 31/0749;
(Continued)

(56) References Cited

U.S. PATENT DOCUMENTS

| | | | | |
|---|---|---|---|---|
| 4,849,029 A | * | 7/1989 | Delahoy | ........... H01L 31/02008 136/249 |
| 5,453,134 A | * | 9/1995 | Arai | .................. H01L 31/03921 136/244 |

(Continued)

FOREIGN PATENT DOCUMENTS

| | | |
|---|---|---|
| EP | 2 533 304 A2 | 12/2012 |
| JP | 2000-228516 A | 8/2000 |

(Continued)

OTHER PUBLICATIONS

Extended European Search Report dated Aug. 12, 2021 in corresponding European Patent Application No. 18910266.8, 8 pages.

*Primary Examiner* — Eric R Smith
(74) *Attorney, Agent, or Firm* — Oblon, McClelland, Maier & Neustadt, L.L.P.

(57) ABSTRACT

According to one embodiment, a solar cell includes a first electrode, a second electrode, a photoelectric conversion layer, and a plurality of insulants. The photoelectric conversion layer is provided between the first electrode and the second electrode. The plurality of insulants is disposed on a face of the first electrode. The face faces the second electrode. Any adjacent two of the plurality of insulants are disposed with a void interposed between the adjacent two.

10 Claims, 4 Drawing Sheets

• • • • • • • + - - - - : DISTANCE BETWEEN INSULANTS ($L_{ins} + L_{abs}$)

- - - - : LENGTH OF VOID ($L_{ins}$)

(58) Field of Classification Search
CPC ......... H01L 31/02168; H01L 31/02327; H01L 31/02363; H01L 31/03529; H01L 31/056; H01L 31/02245; H01L 31/022458; H01L 31/0682; H01L 31/0468; H01L 31/047
See application file for complete search history.

(56) References Cited

U.S. PATENT DOCUMENTS

| | | | |
|---|---|---|---|
| 2003/0221718 A1 | 12/2003 | Kubo et al. | |
| 2008/0115827 A1* | 5/2008 | Woods | H01L 31/03928 136/255 |
| 2011/0312120 A1* | 12/2011 | Weiner | H01L 31/03925 438/64 |
| 2011/0318863 A1* | 12/2011 | Tu | H01L 31/0463 438/68 |
| 2013/0037901 A1* | 2/2013 | Kubo | H01L 27/142 257/431 |
| 2013/0074925 A1* | 3/2013 | Hakuma | H01L 31/022433 136/256 |
| 2014/0209149 A1* | 7/2014 | Mascarenhas | H01L 31/0504 136/249 |
| 2015/0047698 A1* | 2/2015 | Hollars | H01L 31/056 136/256 |
| 2015/0059850 A1* | 3/2015 | Wu | H01L 31/0445 136/259 |
| 2015/0083212 A1* | 3/2015 | Beck | H01L 31/02008 136/256 |
| 2015/0114458 A1* | 4/2015 | Cheng | H01L 31/0322 136/256 |
| 2017/0194519 A1 | 7/2017 | Matsushima et al. | |
| 2017/0222071 A1* | 8/2017 | Ji | H01L 31/18 |
| 2018/0019358 A1 | 1/2018 | Ahn | |
| 2018/0366594 A1 | 12/2018 | Yoshida et al. | |

FOREIGN PATENT DOCUMENTS

| | | | | |
|---|---|---|---|---|
| JP | 2001-202820 A | 7/2001 | | |
| JP | 2001-307786 A | 11/2001 | | |
| JP | 2003-258278 A | 9/2003 | | |
| JP | 2004-064042 A | 2/2004 | | |
| JP | 3616824 B2 | 2/2005 | | |
| JP | 2005-239526 A | 9/2005 | | |
| JP | 2006-009083 A | 1/2006 | | |
| JP | 2006-124753 A | 5/2006 | | |
| JP | 2006-124754 A | 5/2006 | | |
| JP | 2006-236637 A | 9/2006 | | |
| JP | 2008-159996 A | 7/2008 | | |
| JP | 2014-053572 A | 3/2014 | | |
| JP | 2014-170865 A | 9/2014 | | |
| JP | 2016-192554 A | 11/2016 | | |
| JP | 2017-135383 A | 8/2017 | | |
| JP | 2018-011058 A | 1/2018 | | |
| WO | WO-2012138167 A2 * | 10/2012 | ..... H01L 31/035281 | |
| WO | WO 2014/034006 A1 | 3/2014 | | |
| WO | WO 2016/047564 A1 | 3/2016 | | |
| WO | WO 2017/146214 A1 | 8/2017 | | |

* cited by examiner

······· + ---- : DISTANCE BETWEEN INSULANTS ($L_{ins} + L_{abs}$)
---- : LENGTH OF VOID ($L_{ins}$)

·········+ - - - - - : DISTANCE BETWEEN INSULANTS ($L_{ins} + L_{abs}$)
- - - - - : LENGTH OF VOID ($L_{ins}$)

SOLAR CELL, MULTI-JUNCTION SOLAR CELL, SOLAR CELL MODULE, AND SOLAR POWER GENERATION SYSTEM

CROSS-REFERENCE TO RELATED APPLICATIONS

This application is a continuation application of International application No. PCT/JP2018/031452, filed on Aug. 24, 2018, which is based upon and claims the benefit of priority from Japanese Patent Application No. 2018-054825, filed on Mar. 22, 2018; the entire contents of which are incorporated herein by reference.

FIELD

Embodiments described herein relate generally to a solar cell, a multi-junction solar cell, a solar cell module, and a solar power generation system.

BACKGROUND

In the conventional solar cell, by arranging the insulant on the transparent conductive film, the contact area between the photoelectric conversion layer and the transparent conductive film is reduced, and the interface recombination therebetween is suppressed, thereby achieving high efficiency. However, depending on the material of the insulant (passivation layer), it reacts with the photoelectric conversion layer to form an unintended substance. A conductive material could lead to a source of leaks, and even in the case of an insulating material, a band offset failure or an increase in interface defects may occur. In addition, degradation of the film quality of the photoelectric conversion layer itself may occur.

Also, when only the insulant is present on the transparent conductive film, a compound with unintended conductivity or a compound with insulation in which the band offset is shifted may be formed at the interface between the insulant and the photoelectric conversion layer or between the insulant and the transparent conductive film. As a result, good characteristics may not be exhibited and may not function as a solar cell. In addition, the contact between the photoelectric conversion layer and the transparent conductive film may be degraded.

DETAILED DESCRIPTION

According to one embodiment, a solar cell includes a first electrode, a second electrode, a photoelectric conversion layer, and a plurality of insulants. The photoelectric conversion layer is provided between the first electrode and the second electrode. The plurality of insulants is disposed on a face of the first electrode. The face faces the second electrode. Any adjacent two of the plurality of insulants are disposed with a void interposed between the adjacent two.

Hereinafter, embodiments will be described with reference to the drawings. In addition, the same reference sign shall be attached to a common structure through embodiments, and the overlapping description is omitted. Each figure is a schematic diagram for promoting the explanation of the embodiments and their understanding. Although in some portions, the shape, the size, the ratio, etc. differ from the actual device, design changes can be made as appropriate by referring to the following description and known techniques.

First Embodiment

Figure 1:
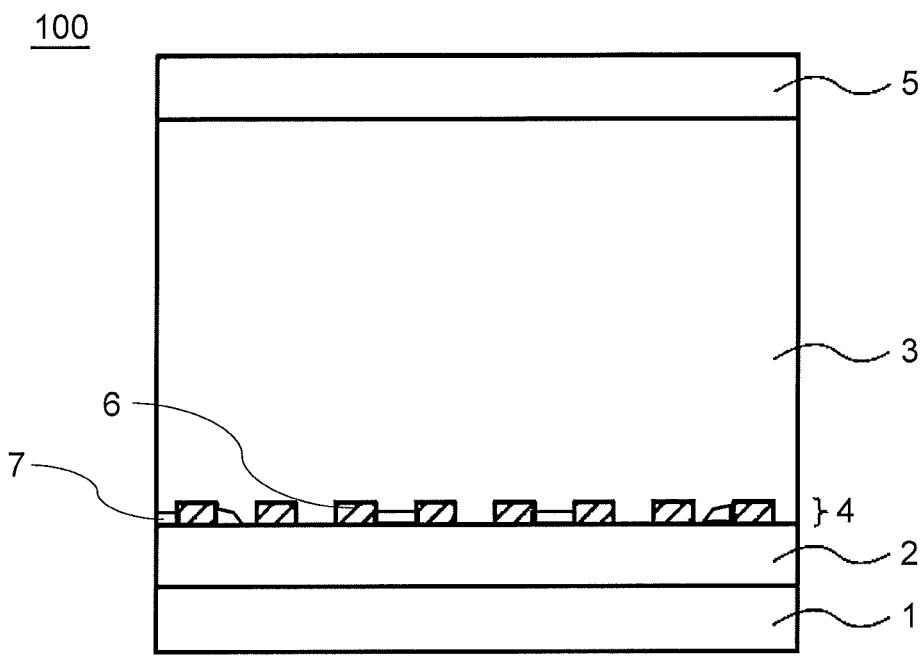
FIG. 1 is a schematic cross-sectional view of a solar cell according to a first embodiment.

The first embodiment relates to a light transmitting solar cell. FIG. 1 shows a schematic cross-sectional view of a solar cell 100 according to the first embodiment. As shown in FIG. 1, the solar cell 100 according to the present embodiment includes a substrate 1, a first electrode 2 on the substrate 1, a light transmissive second electrode 5, and a photoelectric conversion layer 3 between the first electrode 2 and the second electrode 5. A plurality of insulants 6 is disposed on a face of the first electrode 2 where the face faces the second electrode 5. Any two adjacent insulants of the plurality of insulants are disposed with a void 7 interposed therebetween. The insulants 6 and the void 7 may be collectively referred to as an insulator.

An intermediate layer (not shown) may be included between the first electrode 2 and the photoelectric conversion layer 3 or between the photoelectric conversion layer 3 and the second electrode 5. The sunlight is more preferably incident from the upper side of the second electrode 5, but may be incident from the lower side of the first electrode 2.

Generally, the insulants 6 may react with the photoelectric conversion layer 3 to form an unintended substance, but as in this embodiment, the presence of the void 7 at least in part between the insulants 6 can reduce the area of contact between the photoelectric conversion layer 3 and the insulants 6. In addition, since the void 7 is also an insulator, the amount of insulants 6 can be reduced without reducing the amount of insulator, so that the formation of an unintended substance due to the reaction between the photoelectric conversion layer 3 and the insulants 6 can also be suppressed. Therefore, it is possible to suppress the failure of the leak source and the band offset, and the increase of the interface defect. Furthermore, since the difference in refractive index between the photoelectric conversion layer 3 and the void 7 is large, the absorption of light inside the photoelectric conversion layer 3 is increased, and the efficiency can be improved.

When a distortion due to the difference in thermal expansion coefficients of the materials among the substrate 1, the first electrode 2, and the photoelectric conversion layer 3 exists at the electrode interface, it is desirable that the void 7 capable of alleviating the distortion be present. Thereby, the distortion between the photoelectric conversion layer 3 and the first electrode 2 can be alleviated.

The members constituting the solar cell according to the first embodiment will be described.

(Substrate)

It is desirable to use white sheet glass as the substrate 1 according to the first embodiment. It is also possible to use glass such as soda lime glass, quartz, and chemically strengthened glass, a metal plate made of such as stainless steel, Al (aluminum), Ti (titanium) or Cr (chromium), or resin such as polyimide or acrylic. When the substrate is conductive, it can be also used as the first electrode.

(First Electrode)

The first electrode 2 exists between the substrate 1 and the photoelectric conversion layer 3 and is in direct contact with the substrate 1 and the photoelectric conversion layer 3. The first electrode 2 is preferably a laminated film, and includes preferably an oxide transparent conductive film mainly composed of Sn as a first layer in contact with the photoelectric conversion layer 3. The first electrode 2 includes preferably a transparent conductive film (having a lower resistance than that of the oxide transparent conductive film mainly composed of Sn) as a second layer in contact with the substrate 1. The laminated film is preferable because the resistivity of the oxide transparent conductive film (mainly composed of Sn) as the first layer is higher than that of the second layer, and the power generation loss due to the resistance component is large when the first electrode 2 includes only the first layer.

The first layer is preferably an oxide mainly composed of Sn, such as $SnO_2$, and the additive is not limited to a particular material, and may be Zn, Al, Ga, In, Si, Ge, Ti, Cu, Sb, Nb, F, Ta, W, Mo, F, Cl, or the like.

As the second layer, for example, indium tin oxide (ITO), aluminum-doped zinc oxide (AZO), boron-doped zinc oxide (BZO), gallium-doped zinc oxide (GZO), indium-doped zinc oxide (IZO), titanium-doped indium oxide (ITiO) or indium gallium zinc oxide (IGZO), or hydrogen-doped indium oxide (IOH) can be used, and is not particularly limited. The transparent conductive film may be a laminated film, and a film such as tin oxide may be contained in the laminated film in addition to the above oxide. Moreover, lamination of the metal film and the transparent conductive film can also be used. The transparent conductive film is as described above, but the metal film is not limited to a particular metal film, and may be a film of Mo, Au, W, or the like. Further, the first electrode 2 may be an electrode in which a dot-like, line-like or mesh-like metal is provided on the transparent conductive film. At this time, the dot-like, line-like or mesh-like metal is disposed between the transparent conductive film and the photoelectric conversion layer 3. The dot-like, line-like or mesh-like metal preferably has an aperture ratio of 50% or more with respect to the transparent conductive film. The dot-like, line-like or mesh-like metal is not limited to a particular metal, and may be made of Mo, Au, W, or the like.

(Insulant Region)

In the first embodiment, an insulant region 4 has the plurality of insulants 6 on a face of the first electrode 2 where the face faces the second electrode 5, and the void 7 in part between the plurality of insulants 6. When the insulants 6 are present on the interface between the first electrode 2 and the photoelectric conversion layer 3, it is preferable to dispose the insulants 6 evenly. By disposing the insulants 6 in this manner, distortion of the solar cell due to the difference in thermal expansion coefficients at the electrode interface can be easily alleviated.

The insulants 6 preferably do not react with the photoelectric conversion layer 3. Therefore, the insulant 6 preferably contains at least one of Mg, Al, Si, Ca, Sc, Ti, Ga, Ge, Sn, Sb, Hf, Ta, and lanthanide, and at least one of N, O, and S. In particular, nitrides such as $SiO_2$, SiON, $SiN_x$, and $AlN_x$ are preferably included. This is because these materials do not easily react with $Cu_2O$ contained in the photoelectric conversion layer 3, and does not inhibit the operation of the solar cell.

Alternatively, a metal that is easily oxidized can be used as the insulant 6. This is because a metal that is easily oxidized can be oxidized in the later manufacturing process to be the insulant 6.

The shape of the insulant 6 is not limited. For example, when the insulant 6 is viewed from the first electrode 2, it may be circular, cylindrical or square. Moreover, when the solar cell 100 is observed from the cross section obtained by cutting the solar cell 100 in the direction from the second electrode 5 to the first electrode 2, the insulant 6 can take various shapes, such as a triangle, a trapezoid, and a rectangular parallelepiped. Furthermore, an acute angle may be formed between the face directed from the first electrode 2 to the second electrode 5 and the face where the first electrode 2 and the insulant 6 are in contact with each other.

The larger the number of faces to which light enters among the faces possessed by the insulants 6 is, the more the amount of light introduced into the photoelectric conversion layer 3 can be increased. Furthermore, in the case of the multi-junction solar cell described later, the light can be transmitted in the bottom cell direction. Therefore, the insulants 6 possessing the larger number of faces to which light enters is more preferable.

The abundance ratio of the insulants 6 to the area of the solar cell is preferably 1% to 95%. This is because the presence of the insulants 6 of 1% or more can provide the void 7 in the solar cell and can improve the efficiency of the solar cell. In addition, when the abundance ratio of the insulants 6 is greater than 95%, the void 7 may fill the entire space between the insulants 6. When the space between the insulants 6 is completely filled with the void 7, the photoelectric conversion layer 3 and the first electrode 2 does not contact with each other in the portion, so that the performance of the solar cell may be degraded. Therefore, the abundance ratio of the insulants 6 to the area of the solar cell is preferably 95% or less.

Here, the film forming method of the insulants 6 will be described. In film forming the insulants 6, the insulants 6 are formed on the first electrode 2 by lithography or coating. At this time, it is desirable that the insulants 6 are appropriately dispersed in order to secure the contact between the photoelectric conversion layer 3 and the first electrode 2. This is because, in a case where part of the cells is covered with an insulator, the solar cell characteristics may be 0 when a series structure is manufactured.

The abundance ratio of the insulants 6 can be measured as follows.

Part of the solar cell is undercut, and etching or direct polishing is performed from the second electrode 5 side, and the photoelectric conversion layer 3 is cut out. At the time of cut out, attention should be paid to over-etching and over-polishing, and the portion where the first electrode 2 can be visually observed completely is not observed. Imaging by the secondary ion mass spectrometry (SIMS) is performed on the face that was cut out, the observation field is 20 μm×20 μm, and the insulants 6 and the first electrode 2 are identified.

The image thus obtained is binarized by the presence or absence of the insulants 6, the areas of the insulants 6 and the portion where no insulant 6 exists are determined, and the abundance ratio of the insulants 6 is calculated. The calculation formula is as follows.

The abundance ratio of insulants 6=([area of region where insulants 6 are present]/[(area of region where insulants 6 are present)+(area of region where no insulant 6 is present)]). The calculation is performed for 20 places.

Figure 5:
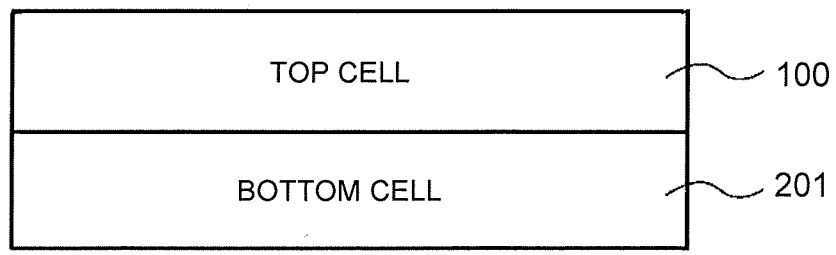
FIG. 5 is a schematic cross-sectional view of a multi-junction solar cell according to a second embodiment.

In the case of a multi-junction solar cell 200 described later (as shown in FIG. 5), a bottom cell 201 is peeled off with respect to the multi-junction solar cell 200 so that a top cell 100 is not damaged, and the abundance ratio of the insulants 6 described above is measured for only the top cell 100.

(Photoelectric Conversion Layer)

The photoelectric conversion layer 3 in the first embodiment is a laminate in which hetero-junction or homo-junction is performed on an n-type compound semiconductor layer and a p-type compound semiconductor layer. The p-type compound semiconductor layer is in direct contact with the first electrode 2 and the n-type compound semiconductor layer. In the case of the sub-straight type, the light transmitted from above the second electrode 5 supplies electrons to the second electrode 5 from the interface between the n-type and p-type compound semiconductor layers. In the case of the super-straight type, light is incident from the direction of the first electrode 2 and supplies electrons to the first electrode 2. The p-type compound semiconductor layer preferably contains $Cu_2O$. This is because, since the band gap is as large as about 2.1 eV, in the multi-junction solar cells described later, when the solar cell 100 according to the present embodiment is used as the top cell and another solar cell (having the photoelectric conversion layer 3 with a narrow band gap such as Si) is used as the bottom cell, the solar cell 100 has high transparency of wavelengths contributing to power generation on the bottom cell, so that it is possible to increase the amount of power generation in the bottom cell.

Further, an additive element may be added to the photoelectric conversion layer 3 for the purpose of adjusting the band gap. The additive element is preferably selected from a Group IA such as Ag, Li, Na, K, Cs or Rb, or a monovalent element, but is not particularly limited.

The thickness of the photoelectric conversion layer 3 can be determined by a cross-sectional observation with a scanning electron microscope (SEM) or a step gauge, and is preferably 100 nm or more and 200,000 nm or less. This is because the thickness of the photoelectric conversion layer 3 is capable of sufficiently absorbing light of a band gap or more and easily transmitting long wavelength light toward the bottom cell. When the film quality is good, the film thickness can be increased. However, when the film thickness is large, recombination within the photoelectric conversion layer 3 increases. Therefore, the optimum film thickness is appropriately adjusted.

The interface between the first electrode 2 and the photoelectric conversion layer 3 is preferably an ohmic contact to holes. It is preferable that, in addition to Cu, an oxide region containing at least one element of Sn and Sb be present between the photoelectric conversion layer 3 and the first electrode 2. Furthermore, it is preferable that a region of the concentration of Sn and Sb of $10^{16}/cm^3$ or more exist only in a region within 1,000 nm from the first electrode 2 inside the photoelectric conversion layer 3.

The n-type compound semiconductor layer exists between the p-type compound semiconductor layer and the second electrode 5, and is in direct contact with each other. It is preferable that, when the first electrode 2 is formed into a film, the characteristic deterioration does not easily occur to the n-type compound semiconductor layer. Examples of the n-type compound semiconductor layer include an oxide layer, a sulfide layer, a nitride and the like. More specifically, the oxide layer used for the n-type is preferably a layer selected from the group consisting of $Zn_{1-x}A_xO_y$ (A=Si, Ge, Sn), $Cu_{2-x}M_xO_y$ (M=Mn, Mg, Ca, Zn, Sr, Ba), $Al_{2-x}Ga_xO_{3-y}$. The sulfide layer used for the n-type is preferably a layer consisting of one or more sulfides selected from the group consisting of $Zn_xIn_{2-2x}S_{3-2x-y}$, $ZnS_y$, $In_xGa_{1-x}S_y$ (for example, InS or $In_2S_3$), and In—Ga—Zn—O.

Here, the film forming method of the photoelectric conversion layer 3 will be described.

The film forming method of the photoelectric conversion layer 3 may be a process such as sputtering. It is not limited to any method as long as the film can be formed while having the void 7 on the first electrode 2 having the insulants 6, but it is necessary to keep in mind the temperature conditions and the atmosphere. When the film is formed at a high temperature to promote crystal growth, the film is in a reducing atmosphere, and the oxygen flow rate needs to be increased. When the film is formed at a low temperature, it is necessary to reduce the oxygen flow rate because the film is in an oxidizing atmosphere. When the temperature is too low, the amount of oxygen required to produce the photoelectric conversion layer 3 will be very small, so that a higher performance vacuum device will be required and film formation will be difficult. Moreover, the characteristic of a solar cell will be degraded because the ratio of an impurity increases. In particular, when the impurity is present at the pn interface, the characteristic degradation is remarkable.

For this reason, it is desirable to form a film at high temperature. However, when the temperature is excessively high (for example, a temperature higher than 600° C.), some substrates 1 may be largely deformed, and film formation after that may be difficult. However, this temperature differs depending on the measurement environment and is only a guide.

The film formation of the photoelectric conversion layer 3 will be specifically described by taking the photoelectric conversion layer 3 containing $Cu_2O$ as an example.

First, the insulants 6 are deposited on the first electrode 2. At this time, the insulants 6 are formed by a spray method or photolithography, or once the insulants 6 are uniformly formed on the first electrode 2, and the uniform insulants 6 are patterned into a plurality of insulants 6 of any shape by laser (or mechanical) scribing or laser ablation.

Next, the film in which the insulants 6 are disposed on the first electrode 2 described above is introduced into a sputtering device, and evacuation is performed. This is followed by heating. The heating temperature is preferably 400° C. or more and 600° C. or less. In order to form a high quality p-type layer, 450° C. to 550° C. is preferable. A low temperature of less than 400° C. is not preferable because the film quality of the p-type layer is degraded.

Thereafter, film formation of the p-type layer is started. $O_2$ is introduced into the sputtering device with respect to the Ar flow rate, and Cu is sputtered. Care must be taken because, when the flow rate of oxygen at the time of sputtering is low, Cu remains unreacted, and when it is high, the reaction proceeds too much to generate CuO. Pre-sputtering is performed on a Cu target using an RF power supply with the shutter closed for about 2 minutes to remove surface adsorbate and the like. Sputtering is performed for 50 minutes with the shutter open. In this way, the film thickness of the p-type layer can be about 2 μm. After the completion of sputtering, the introduction of Ar and $O_2$ is stopped and annealing is performed.

The method for forming the n-type layer is the same as the method used for forming the p-type layer except that it is performed at room temperature. For example, when Zn—Ge—O is used for the n-type layer, an appropriate amount of $O_2$ is introduced into the sputtering device with respect to the Ar flow rate. By changing the amount of power applied to the Zn source and the Ge source, it is possible to change the Zn/Ge ratio, and it is possible to adjust an appropriate band offset. At this time, when the film thickness of the n-type layer is too large, the efficiency decreases due to recombination within the n-type layer, which is not preferable.

When forming the n-type layer, in order to suppress damage to the p-type layer, it is desirable to form a film at low temperature and low output when sputtering is performed.

The other methods include a chemical bath deposition (CBD), a chemical vapor deposition (CVD), an atomic layer deposition (ALD), a coating method, and the like.

(Void)

The void 7 according to the first embodiment is present at least in part between the insulants 6 present in the insulant region 4. The void 7 is formed together with the film formation of the photoelectric conversion layer 3 described above. In order to observe the shape of the void 7, for example, the insulant region 4 is observed in a TEM bright-field image at an acceleration voltage of 200 kV and at a magnification of 50,000 times from the second electrode 5 side using a JEM-ARM200F manufactured by JEOL Ltd. When the void 7 is analyzed using an energy dispersive X-ray spectroscopy (EDX) of TEM, the void 7 can be observed together with the observation of the TEM bright-field image by setting the area where the detection value of the main constituent element is 50% or less as the void 7.

Although the void 7 exists in at least a part of the space between the insulants 6, the void 7 does not necessarily have to be in contact with the insulants 6. For example, the void 7 is in contact with the first electrode 2, but the photoelectric conversion layer 3 is present between the insulant 6 and the void 7. The void 7 is not in contact with any of the first electrode 2 and the insulant 6. The void 7 is in contact with insulant 6, but is not in contact with the first electrode 2. The void 7 exists between the insulants 6, but is not in contact with the first electrode 2. In addition, the void 7 may be present to cover a part of the insulant 6.

Regardless of the shape of the void 7, the presence of the void 7 can reduce the contact between the photoelectric conversion layer 3 and the first electrode 2, and the light absorption in the photoelectric conversion layer 3 is further increased, which is preferable. As mentioned earlier, this is because, in addition to being able to suppress the degradation of the performance of the solar cell due to the unintended reaction product of the insulants 6 and the photoelectric conversion layer 3, the presence of the void 7 introduces a region with a low refractive index. As a result, by reflecting a light inside the photoelectric conversion layer 3, it is possible to reduce the loss of power generation of the light which is not sufficiently absorbed by the photoelectric conversion layer 3. For this reason, for example, in a case where there are two solar cells and the amount of both insulators therein is the same, by comparing an efficiency of one solar cell having the void 7 with an efficiency of the other solar cell having no void 7, the former solar cell improves the efficiency. Further, for example, in two solar cells, in a case where the amount of the void 7 in one solar cell is the same as the amount of insulants 6 in the other solar cell, and the void 7 does not exist in the other solar cell, the one solar cell having the void 7 improves the efficiency.

Also, if the solar cell operates with, for example, the contact resistance between the photoelectric conversion layer 3 and the first electrode 2 of 1 $\Omega cm^2$ or less, in a case where the resistance of the first electrode 2 is a material of $10^{-3}$ $\Omega cm^2$, the solar cell operates with the contact area of $\frac{1}{1000}$. Therefore, even when the insulating region between the photoelectric conversion layer 3 and the first electrode 2 increase due to the void 7, in a case where the contact resistance is low, the performance of the solar cell is not significantly reduced.

The size of the void 7 existing between the insulants 6 is influenced by the abundance ratio of the insulants 6. Therefore, the higher the abundance ratio of the insulants 6 is, the higher the porosity described later is. The higher the porosity is, the higher the light absorption in the photoelectric conversion layer 3 described above is. However, when covering the entire first electrode 2 with the insulants 6 and the void 7, as described above, the photoelectric conversion layer 3 and the first electrode 2 are not in contact with each other, so that it is not possible to generate electricity. Moreover, the region insulated may become larger than the diffusion length in the photoelectric conversion layer 3. When the insulants 6 and the void 7 exist on the first electrode 2, mainly in the vertical direction from the substrate 1, electrons and holes (separated in the photoelectric conversion layer 3 between the insulants 6, the void 7, and the second electrode 5) cannot reach the corresponding electrodes and are deactivated. As a result, loss of photoelectric flow may easily occur. This does not apply as long as the diffusion length of the electrons and holes in the photoelectric conversion layer 3 is sufficiently long. In the super-straight type, when the combined length of the insulants 6 and the void 7 is larger than the diffusion length, in the photoelectric conversion layer 3 between the second electrode 5 and the insulants 6, electrons (separated in the photoelectric conversion layer 3 near the center of the insulant 6) may not reach the first electrode 2 and may be deactivated, which is not preferable. In the sub-straight type, holes may not reach the first electrode 2 and may be deactivated, which is not preferable. Therefore, the porosity is preferably 1% or more and 99% or less. This is because the porosity in this range makes it possible to heighten absorption of the light in the photoelectric conversion layer 3 while maintaining the contact between the first electrode 2 and the photoelectric conversion layer 3. More preferably, it is 8% or more and 80% or less. This is because the porosity in this range makes it possible to reduce the loss of power generation of light which is not sufficiently absorbed by the photoelectric conversion layer 3 while reducing the insulants 6, and to reflect the light inside of the photoelectric conversion layer 3.

In addition, when the void 7 exists, in the solar cell according to the present embodiment, the difference in the thermal expansion coefficients among the substrate 1, the first electrode 2, and the photoelectric conversion layer 3 can suppress the bending of the solar cell. The bending of the solar cell in the direction of the second electrode 5 may cause a crack in the photoelectric conversion layer 3 to cause an insulation or a conductivity on the cracked face, which may cause a short circuit, which is not preferable. The occurrence of cracks or wrinkles in the photoelectric conversion layer 3 reduces the diffusion length of electrons and holes inside the photoelectric conversion layer 3, which leads to a decrease in efficiency. Moreover, in a multi-junction solar cell described later, when there is an extra "gap" between the top cell and bottom cell, the thickness of the "gap" differs depending on the location therebetween, and a part of the wavelength to be absorbed in the bottom cell is not effectively absorbed. It may lead to a decrease in efficiency of the bottom cell, which is not preferable. In addition, when the solar cell is enlarged while bending, the thickness of the solar cell is increased, and the solar cell is easily broken during or after installation. Therefore, less curvature is preferable.

The abundance of the void 7 can be determined from the porosity measured from a cross section of the solar cell. The smaller the abundance of void 7 is, the smaller the porosity is. Here, the porosity is a ratio of voids 7 existing between a certain insulant 6 and another insulant 6 (closest to the certain insulant) to a distance between the certain insulant 6 and another insulant 6.

Figure 2:
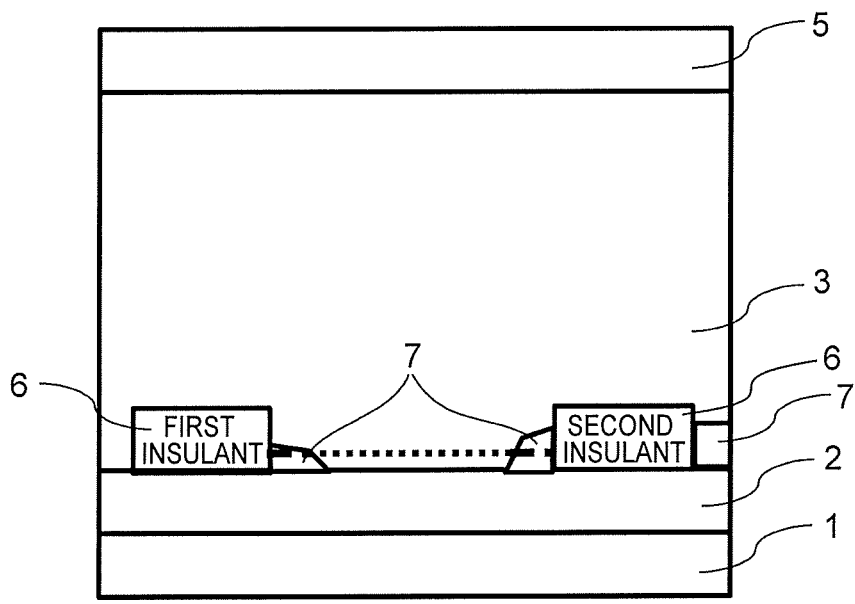
FIG. 2 is a cross-sectional view showing an outline of porosity measurement.
Figure 3:
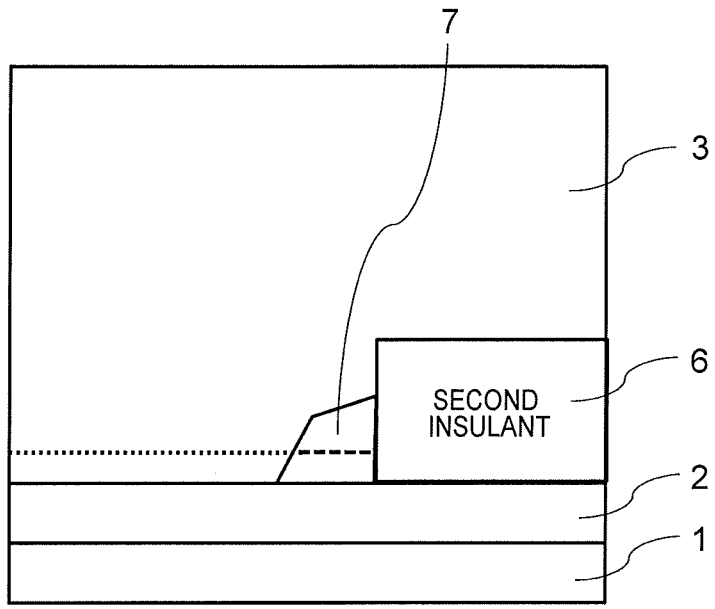
FIG. 3 is an enlarged cross-sectional view showing an outline of porosity measurement.

Here, a method of measuring the porosity will be described. The porosity is measured by imaging TEM bright-field images of 20 locations (20 cross sections) of the solar cell and using the TEM images. The image of the measurement is shown in FIG. 2 and FIG. 3. FIG. 2 is a cross-sectional view showing an outline of a porosity measurement, and FIG. 3 is an enlarged cross-sectional view showing the outline of the porosity measurement.

First, in order to make a cross section of the solar cell, the solar cell is cut along a straight line passing through a certain insulant 6 and another insulant 6 closest to the certain insulant 6 to make the cross section. The closest insulant 6 that is identified by observing the solar cell from the substrate 1 side.

The cross section of the solar cell is observed by the TEM. First, the obtained cross section is made into a sample suitable for TEM imaging using a focused ion beam (FIB) method. For observation of the manufactured sample, an acceleration voltage is set to 200 kV using JEM-ARM200F manufactured by JEOL Ltd, so that two insulants 6 and the void 7 exist in the field of view. For convenience, two insulants 6 being imaged are referred to as a first insulant 6 and a second insulant 6.

For each of TEM images of 20 cross sections obtained in this manner, respective maximum distances between a face of the first electrode 2 and a face of the first insulant 6, and a face of the first electrode 2 and a face of the second insulant 6 in a direction toward the second electrode 5. The respective maximum distances are the maximum thickness of each insulant 6. The distances at this time are Rd1 and Rd2.

Next, a ratio of a length of the void 7 to a length of a portion where the photoelectric conversion layer 3 exists during imaging is determined. At this time, the TEM image is appropriately enlarged, and the ratio of the length of the void 7 to the length of the photoelectric conversion layer 3 is determined.

This ratio is determined as follows. Space between the first insulant 6 and the second insulant 6 is connected with a straight line parallel to the first electrode 2 in each TEM image. The length of the void 7 on the straight line (when there is a break, the sum of the length of each void) is obtained. The length of the portion of the photoelectric conversion layer 3 on the straight line (when there is a break, the sum of the length of each portion of photoelectric conversion layer 3) is obtained. The length of the void and the length of the photoelectric conversion layer 3 are denoted as $L_{ins}$ and $L_{abs}$, respectively.

The $L_{ins}$ and $L_{abs}$ are determined at 10 nm intervals for the height from immediately above the first electrode 2 to Rd1 or Rd2, whichever is smaller, min(Rd1, Rd2). The $L_{ins}$ and $L_{abs}$, and the ratio of the length of the void 7 to the distance between the insulants 6 at respective height, which is (Rsp)=$L_{ins}/(L_{ins}+L_{abs})$, are determined.

Among Rsp=$L_{ins}/(L_{ins}+L_{abs})$ at the height up to min (Rd1, Rd2) thus determined, Max (Rsp) is defined as the porosity.

Many refractive indexes of the photoelectric conversion layer 3 and the first electrode 2 exhibit relatively high values, and reflection at their interface is easily suppressed. Light not absorbed sufficiently by the photoelectric conversion layer 3 is a loss of power generation, so that it is desirable to be reflected before the first electrode 2. The presence of the void 7 introduces a region with a low refractive index, so that the light can be reflected inside the photoelectric conversion layer 3.

For this reason, in the solar cell according to the present embodiment, even if the porosity obtained from the TEM cross-sectional observation result of a part of 20 cross sections is about 0%, if the average porosity of 20 cross sections is about 1% or more, diffuse reflection of light by the void 7 can increase the conversion efficiency of the photoelectric conversion layer 3. As a result, the efficiency of the solar cell can be improved.

When the porosity is 8% or more, furthermore, the contact between the photoelectric conversion layer 3 and the first electrode 2 can be reduced, and the generation loss can be reduced, so that the efficiency of the solar cell can be further improved, which is more preferable.

In addition, instead of the void 7, a compound containing at least one selected from a group consisting of S, Se, Te, N, and O can be included. In this case, a value corresponding to the porosity can also be measured in the same manner as the porosity.

(Second Electrode)

In FIG. 1, the second electrode 5 is in direct contact with the photoelectric conversion layer 3. A transparent conductive film is preferable as the second electrode 5. The transparent conductive film can be made of the material same as that of the first electrode 2.

The composition and the like of the solar cell 100 can be obtained by an X-ray photoelectron spectroscopy (XPS) and a SIMS. In addition, the thickness and the particle size of each layer may be obtained by an observation of a cross section of the solar cell 100 with the TEM at a magnification of 100,000 times.

Here, a method of manufacturing the solar cell according to the first embodiment will be described.

(Manufacturing Method)

Figure 4:
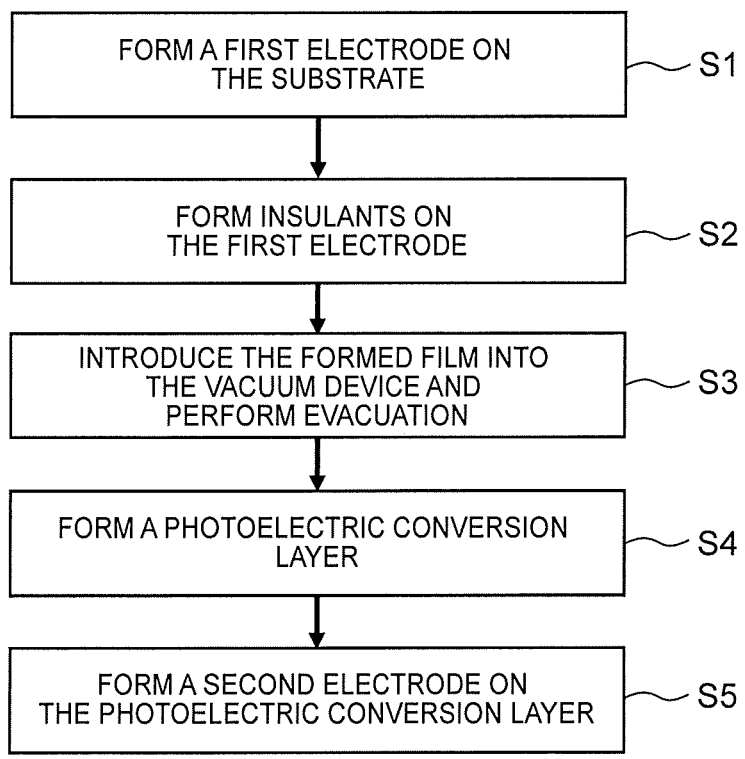
FIG. 4 is a flowchart showing a method of manufacturing a solar cell according to the first embodiment.

FIG. 4 is a flowchart showing the method of manufacturing a solar cell according to the embodiment.

A material to be the first electrode 2 is formed on the substrate 1 by sputtering or the like under vacuum conditions (S1). Next, the insulants 6 are formed on the first electrode 2. At this time, the method as described above is used (S2). Thereafter, this formed film is introduced into the vacuum device, and evacuation is performed (S3). A material to be the photoelectric conversion layer 3 is formed by sputtering or the like under vacuum conditions (S4). Thereafter, a material to be the second electrode 5 is formed on the photoelectric conversion layer 3 by sputtering or the like (S5). A super-straight type or a sub-straight type may be manufactured.

The manufacturing method is not limited to the above. For example, the other methods include a chemical bath deposition (CBD), a chemical vapor deposition (CVD), an atomic layer deposition (ALD), a coating method, and the like.

The solar cell according to the present embodiment includes the first electrode 2, the second electrode 5, the photoelectric conversion layer 3 provided between the first electrode 2 and the second electrode 5, a plurality of insulants 6 disposed on a face of the first electrode 2 where the face faces the second electrode 5, and the void 7 disposed in at least a part between the plurality of insulants 6. By providing the void 7 between the insulants 6, it is possible to suppress the formation of an unintended reaction product by the insulants 6 while reducing the contact between the photoelectric conversion layer 3 and the first electrode 2. Furthermore, since the difference in refractive index between the photoelectric conversion layer 3 and the void 7 is large, the absorption inside the photoelectric conversion layer 3 is increased, and the conversion efficiency can be improved. In addition, when there is the distortion due to the difference in thermal expansion coefficients at the electrode interface, the presence of the void 7 can also relieve the distortion.

Second Embodiment

The second embodiment relates to a multi-junction solar cell. FIG. 5 is a schematic cross-sectional view of the multi-junction solar cell 200 of second embodiment. The multi-junction solar cell 200 of FIG. 5 includes the solar cell (first solar cell) 100 of the first embodiment on the light incident side and a second solar cell 201. The band gap of the photoelectric conversion layer of the second solar cell 201 is smaller than the band gap of the photoelectric conversion layer 3 of the solar cell 100 of the first embodiment. The multi-junction solar cell of the second embodiment also includes multi-solar cell in which three or more solar cells are joined.

Since the band gap of the photoelectric conversion layer 3 of the solar cell 100 of the first embodiment is about 2.0 to 2.4 eV, the band gap of the photoelectric conversion layer of the second solar cell 201 is preferably 1.0 eV or more and 1.7 eV or less. The photoelectric conversion layer of the second solar cell 101 is preferably a compound semiconductor layer such as any one or more of CIGSSe-based, CIT-based, CIS-based and CdTe-based having a high "In" content, or one selected from a group consisting of a crystalline silicon and a perovskite compound.

Third Embodiment

Figure 6:
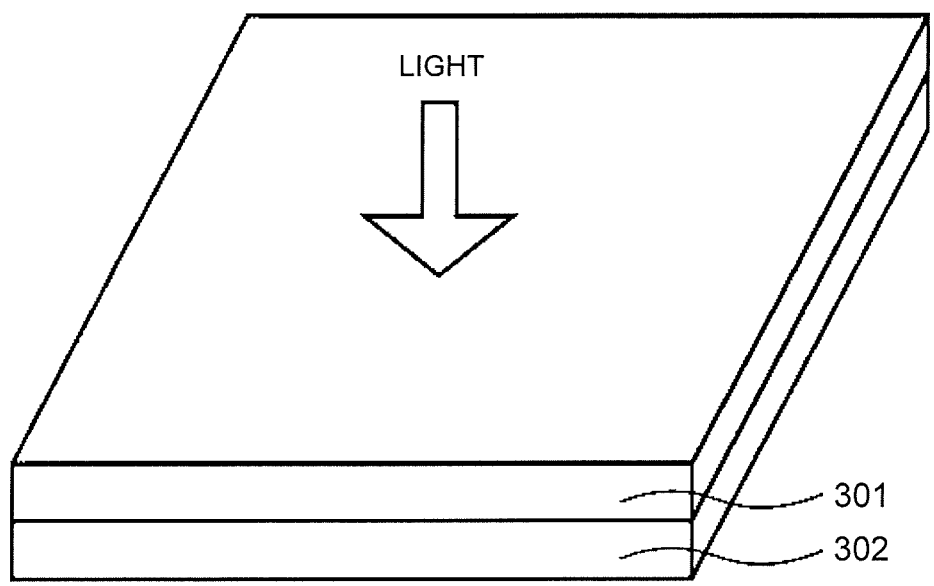
FIG. 6 is a schematic perspective view of a solar cell module according to a third embodiment.

The third embodiment relates to a solar cell module. FIG. 6 is a schematic perspective view of a solar cell module 300 of the third embodiment. The solar cell module 300 of FIG. 6 is a solar cell module in which a first solar cell module 301 and a second solar cell module 302 are laminated. The first solar cell module 301 is on the light incident side, and is the solar cell 100 of the first embodiment. The second solar cell module 302 is preferably the second solar cell 201.

Figure 7:
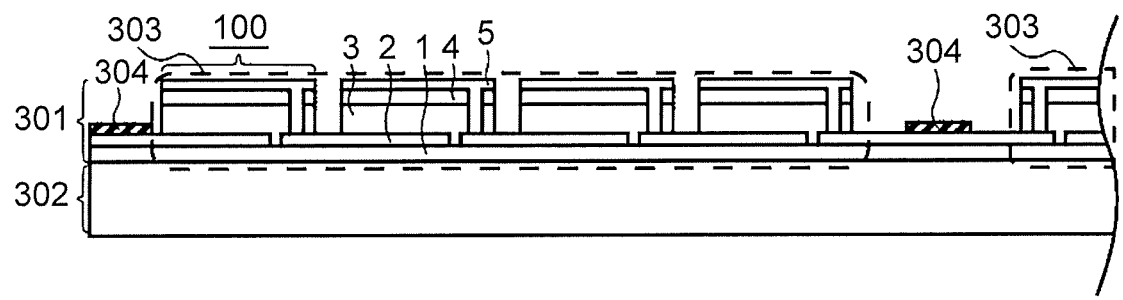
FIG. 7 is a schematic cross-sectional view of a solar cell module according to the third embodiment.

FIG. 7 is a schematic cross-sectional view of the solar cell module 300. In FIG. 7, the structure of the first solar cell module 301 is shown in detail, while the structure of the second solar cell module 302 is not shown. In the second solar cell module 302, the structure of the solar cell module is appropriately selected according to the photoelectric conversion layer of the solar cell to be used. The solar cell module of FIG. 7 includes a plurality of submodules 303 surrounded by a broken line in which a plurality of solar cells 100 (solar battery cell) is electrically connected in series side by side in the lateral direction. The plurality of submodules 303 is electrically connected in parallel or in series. The adjacent submodules 303 are electrically connected by a bus bar 304.

The solar cell 100 is scribed, and adjacent two solar cells 100 are connected to each other by the connection of the upper second electrode 5 of one solar cell and the lower first electrode 2 of the other solar cell. As in the solar cell 100 of the first embodiment, the solar cell 100 of the third embodiment includes the substrate 1, the first electrode 2, the second electrode 5, and the photoelectric conversion layer 3. A plurality of insulants 6 disposed on the face of the first electrode 2 facing the second electrode 5 is spaced apart from each other. The void 7 is provided in at least a part between the plurality of insulants 6. It is preferable that both ends of the solar cell 100 in the submodules 303 are connected to the bus bars 304, and the bus bars 304 electrically connect the plurality of submodules 303 in parallel or in series to adjust the output voltage with the second solar cell module 302.

Fourth Embodiment

Figure 8:
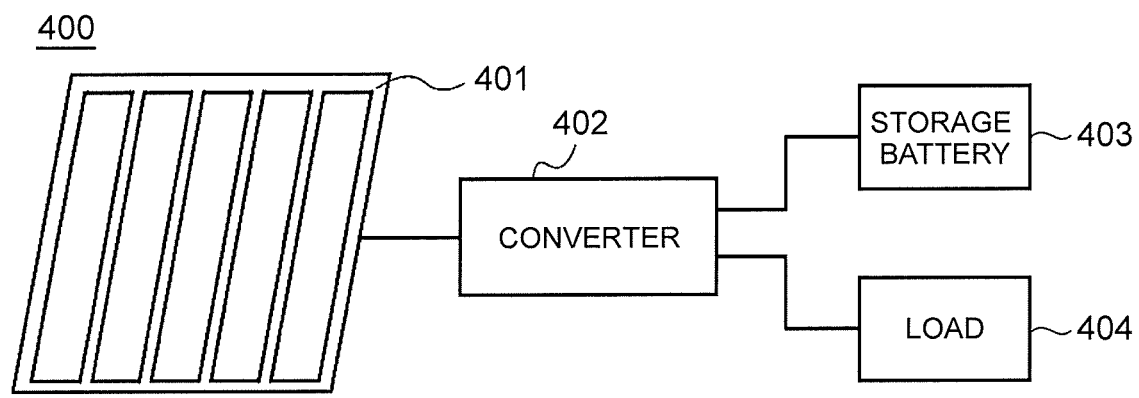
FIG. 8 is a structural schematic view of a solar power generation system according to a fourth embodiment.

The fourth embodiment relates to a solar power generation system. The solar cell module 300 of the third embodiment can be used as a generator for generating electricity in the solar power generation system of the fourth embodiment. The solar power generation system according to the embodiment generates power using a solar cell module, and in particular, includes a solar cell module that generates electricity, a unit for converting the generated electricity into electric power, and a storage unit for storing the generated electricity or a load for consuming the generated electricity. FIG. 8 is a structural schematic view of a solar power generation system 400 of the embodiment. The solar power generation system 400 of FIG. 8 includes a solar cell module 401 (300), a converter 402, a storage battery 403, and a load 404. Either the storage battery 403 or the load 404 may be omitted. The load 404 may be configured to be able to use the electrical energy stored in the storage battery 403. The converter 402 is a device including a circuit or element for performing power conversion such as transformation or DC/AC conversion such as a DC-DC converter, a DC-AC converter, and an AC-AC converter. The configuration of the converter 402 may be any suitable configuration depending on the configuration of the generated voltage, the storage battery 403 and the load 404.

The solar battery cell included in the submodules 303 (included in the solar cell module 300) which receives light generates power, the electrical energy is converted by the converter 402, and is stored by the storage battery 403 or consumed by the load 404. It is preferable that the solar cell module 401 include a sunlight tracking drive device for constantly directing the solar cell module 401 to the sun, a light condensing body that collects and condenses sunlight, or a device for improving the power generation efficiency.

The solar power generation system 400 is preferably used for real estate such as a residence, a commercial facility or a factory, or used for moving property such as a vehicle, an aircraft, an electronic device, and the like. By using the photoelectric conversion element excellent in conversion efficiency of the embodiment for the solar cell module 401, an increase in the amount of power generation is expected.

Hereinafter, the present invention will be more specifically described based on examples, but the present invention is not limited to the following examples.

EXAMPLES

The top cell is manufactured, and the conversion efficiency and the porosity of the solar cell are measured.

Example 1

First, a method of manufacturing a top cell will be described. White sheet glass was used as a substrate. ITO (150 nm) and $SnO_2$ (100 nm) were formed by sputtering as a first electrode (rear first electrode). SiO fine particles were applied by a spray method. At this time, the abundance ratio of SiO fine particles in the solar cell (abundance ratio of insulant) was adjusted to be 0.05%. The substrate was introduced into the sputtering device by the method described in the first embodiment, and evacuation was performed. The substrate was heated to 500° C., and Cu sputtering was performed. At this time, the sputtering was performed as described in the first embodiment.

The film forming method of the n-type layer was also performed as described in the first embodiment. The n-type includes Zn—Ge—O.

ZnO: Al is formed as a second electrode (upper first electrode) by sputtering. The substrate temperature is preferably room temperature–150° C. When film formation is performed at a relatively low temperature, the open circuit voltage tends to be large, which is preferable.

$MgF_2$ is vapor deposited on the second electrode to a thickness of about 100 nm as an antireflective film.

The method of measuring the conversion efficiency is as follows.

Using a solar simulator that simulates a light source of AM 1.5 G, the light quantity is adjusted to 1 sun using a Si cell as a reference under the light source. The ambient temperature is 25° C. When the horizontal axis is voltage and the vertical axis is current density, the point that intersects the horizontal axis is Voc. A voltage sweep from a value (for example, 2.0 V) that covers Voc with a voltmeter to a range where the Jsc can be measured (minus range, for example, −0.4 V) is performed to measure the current value at this time. The current value divided by the area of the solar cell represents a current density ($mA/cm^2$), and the value of the current density at an applied voltage of 0V represents a Jsc (short circuit current density).

The efficiency η is calculated by formula: η=Voc×Jsc×FF/P×100. P is the incident power density, and the pseudo-sunlight of AM 1.5 is calibrated with the reference solar battery cell.

The solar cell efficiency FF is determined by formula: FF=Vmpp×Jmpp/(Voc×Jsc). Vmpp and Jmpp are values of V and J at the point at which the product of V×J becomes the largest.

At this time, in Table 1, the solar cell efficiency (FF) of the example was calculated based on a comparative example described later. The efficiency of the comparative example is η. The result of 1.02η or more and less than 1.05η is represented by ○, and the result of 1.05η or more is represented by ◉.

The method of measuring the porosity uses the method described in the first embodiment.

The results are summarized in Table 1. The results of Examples 2 to 28 and Comparative Examples 1 to 7 are similarly summarized in Table 1.

Example 2

The sample was prepared as in Example 1 except that the substrate temperature was 450° c.

Example 3

The sample was prepared as in Example 1 except that the substrate temperature was 550° C.

Example 4

The sample was prepared as in Example 1 except that the substrate temperature was 410° C.

Comparative Example 1

The sample was prepared as in Example 1 except that the substrate temperature was 570° C.

Example 5

The sample was prepared as in Example 1 except that the abundance ratio of the insulants in the solar cell was 0.1%.

Example 6

The sample was prepared as in Example 5 except that the substrate temperature was 450° C.

Example 7

The sample was prepared as in Example 5 except that the substrate temperature was 550° C.

Example 8

The sample was prepared as in Example 5 except that the substrate temperature was 410° C.

Comparative Example 2

The sample was prepared as in Example 5 except that the substrate temperature was 570° C.

Example 9

The sample was prepared as in Example 1 except that the abundance ratio of the insulants in the solar cell was 1%.

Example 10

The sample was prepared as in Example 9 except that the substrate temperature was 450° C.

Example 11

The sample was prepared as in Example 9 except that the substrate temperature was 550° C.

Example 12

The sample was prepared as in Example 9 except that the substrate temperature was 410° C.

Comparative Example 3

The sample was prepared as in Example 9 except that the substrate temperature was 570° C.

Example 13

The sample was prepared as in Example 1 except that the abundance ratio of the insulants in the solar cell was 5%.

Example 14

The sample was prepared as in Example 13 except that the substrate temperature was 450° C.

Example 15

The sample was prepared as in Example 13 except that the substrate temperature was 550° C.

Example 16

The sample was prepared as in Example 13 except that the substrate temperature was 410° C.

Comparative Example 4

The sample was prepared as in Example 13 except that the substrate temperature was 570° C.

Example 17

The sample was prepared as in Example 1 except that the abundance ratio of the insulants in the solar cell was 10%.

Example 18

The sample was prepared as in Example 17 except that the substrate temperature was 450° C.

Example 19

The sample was prepared as in Example 17 except that the substrate temperature was 550° C.

Example 20

The sample was prepared as in Example 17 except that the substrate temperature was 410° C.

Comparative Example 5

The sample was prepared as in Example 17 except that the substrate temperature was 570° C.

Example 21

The sample was prepared as in Example 1 except that the abundance ratio of the insulants in the solar cell was 25%.

Example 22

The sample was prepared as in Example 21 except that the substrate temperature was 450° C.

Example 23

The sample was prepared as in Example 21 except that the substrate temperature was 550° C.

Example 24

The sample was prepared as in Example 21 except that the substrate temperature was 410° C.

Comparative Example 6

The sample was prepared as in Example 21 except that the substrate temperature was 570° C.

Example 25

The sample was prepared as in Example 1 except that the abundance ratio of the insulants in the solar cell was 50%.

Example 26

The sample was prepared as in Example 25 except that the substrate temperature was 450° C.

Example 27

The sample was prepared as in Example 25 except that the substrate temperature was 550° C.

Example 28

The sample was prepared as in Example 25 except that the substrate temperature was 410° C.

Comparative Example 7

The sample was prepared as in Example 25 except that the substrate temperature was 570° C.

TABLE 1

| | Abundance ratio of insulants (%) | Porosity (%) | Efficiency |
|---|---|---|---|
| Example 1 | 0.05 | 79 | ◉ |
| Example 2 | 0.05 | 9 | ◉ |
| Example 3 | 0.05 | 85 | ○ |
| Example 4 | 0.05 | 2 | ○ |
| Comparative Example 1 | 0.05 | 0 | X |
| Example 5 | 0.1 | 79 | ◉ |
| Example 6 | 0.1 | 9 | ◉ |
| Example 7 | 0.1 | 85 | ○ |
| Example 8 | 0.1 | 2 | ○ |
| Comparative Example 2 | 0.1 | 0 | X |
| Example 9 | 1 | 78 | ◉ |
| Example 10 | 1 | 9 | ◉ |
| Example 11 | 1 | 84 | ○ |
| Example 12 | 1 | 3 | ○ |
| Comparative Example 3 | 1 | 0 | X |
| Example 13 | 5 | 78 | ◉ |
| Example 14 | 5 | 11 | ◉ |
| Example 15 | 5 | 86 | ○ |
| Example 16 | 5 | 3 | ○ |
| Comparative Example 4 | 5 | 0 | X |
| Example 17 | 10 | 77 | ◉ |
| Example 18 | 10 | 10 | ◉ |
| Example 19 | 10 | 86 | ○ |
| Example 20 | 10 | 3 | ○ |
| Comparative Example 5 | 10 | 0 | X |
| Example 21 | 25 | 72 | ◉ |
| Example 22 | 25 | 12 | ◉ |
| Example 23 | 25 | 86 | ○ |
| Example 24 | 25 | 5 | ○ |
| Comparative Example 6 | 25 | 0 | X |
| Example 25 | 50 | 59 | ◉ |
| Example 26 | 50 | 17 | ◉ |

TABLE 1-continued

|  | Abundance ratio of insulants (%) | Porosity (%) | Efficiency |
|---|---|---|---|
| Example 27 | 50 | 79 | ○ |
| Example 28 | 50 | 6 | ○ |
| Comparative Example 7 | 50 | 0 | X |

As shown in Table 1, it can be seen that the presence of the voids improves the efficiency of the solar cell. This is because light can be reflected by the presence of a void having a low refractive index, and light absorbable by the photoelectric conversion layer can be increased. Furthermore, it turns out that the efficiency of the solar cell is improved most with the porosity of 8% or more and 80% or less. This is because the contact between the photoelectric conversion layer and the first electrode can be reduced, and light absorbable by the photoelectric conversion layer can be increased.

In any of the embodiments described above, it can be seen that the solar cell having the void has higher conversion efficiency than the solar cell having no void.

While certain embodiments have been described, these embodiments have been presented by way of examples only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell comprising:
a first electrode;
a second electrode;
a photoelectric conversion layer provided between the first electrode and the second electrode; and
a plurality of insulants disposed on a face of the first electrode,
the face facing the second electrode through the photoelectric conversion layer,
the plurality of insulants being not passing through the photoelectric conversion layer,
wherein the plurality of insulants comprises a plurality of adjacent insulant pairs,
wherein each of the plurality of adjacent insulant pairs comprises a void interposed between the insulants of the adjacent insulant pair, the void being in contact with the photoelectric conversion layer and at least a part of the insulants of the adjacent insulant pair.

2. The solar cell according to claim 1, wherein,
in each of a plurality of cross sections of the solar cell,
virtual straight lines are provided between an insulant and another insulant closest to the insulant in an adjacent insulant pair in parallel at 10 nm intervals along a direction from the first electrode to the second electrode,
a ratio of a length of the void interposed between the insulants of the adjacent insulant pair to a length of each virtual straight line between the insulant and the another insulant is determined, and
when a maximum value of respective ratios of the length of the void at 10 nm intervals is taken as a porosity, an average of respective porosities of the plurality of cross sections is 1% or more and 99% or less.

3. The solar cell according to claim 1, wherein,
in each of a plurality of cross sections of the solar cell,
virtual straight lines are provided between an insulant and another insulant closest to the insulant in an adjacent insulant pair in parallel at 10 nm intervals along a direction from the first electrode to the second electrode,
a ratio of a length of the void interposed between the insulants of the adjacent insulant pair to a length of each virtual straight line between the insulant and the another insulant is determined, and
when a maximum value of respective ratios of the length of the void at 10 nm intervals is taken as a porosity, an average of respective porosities of the plurality of cross sections is 8% or more and 80% or less.

4. The solar cell according to claim 1, wherein
at least a part of each void is in contact with the first electrode.

5. The solar cell according to claim 1, wherein
the photoelectric conversion layer contains $Cu_2O$.

6. The solar cell according to claim 1, wherein
each of the insulants contains at least one of Mg, Al, Si, Ca, Sc, Ti, Ga, Ge, Sn, Sb, Hf, Ta and lanthanide, and at least one of N, O and S.

7. The solar cell according to claim 1, further comprising:
a substrate on which the first electrode is provided,
wherein the plurality of insulants are not in contact with the substrate.

8. A multi-junction solar cell including the solar cell according to claim 1.

9. A solar cell module including the multi-junction solar cell according to claim 8.

10. A solar power generation system including the solar cell module according to claim 9.

* * * * *